United States Patent
Hassan et al.

(10) Patent No.: US 11,658,690 B2
(45) Date of Patent: May 23, 2023

(54) TRANSCEIVER DROOP CALIBRATION

(71) Applicant: QUALCOMM Incorporated, San Diego, CA (US)

(72) Inventors: Muhammad Hassan, San Diego, CA (US); Jeremy Darren Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/443,136

(22) Filed: Jul. 21, 2021

(65) Prior Publication Data
US 2023/0024839 A1   Jan. 26, 2023

(51) Int. Cl.
*H04B 1/40* (2015.01)
*H04B 1/04* (2006.01)
*H04B 17/12* (2015.01)

(52) U.S. Cl.
CPC ............... *H04B 1/04* (2013.01); *H04B 1/40* (2013.01); *H04B 17/12* (2015.01)

(58) Field of Classification Search
CPC ...... H04B 1/04; H04B 1/0458; H04B 1/0475; H04B 1/0483; H04B 17/12; H04B 17/13
See application file for complete search history.

(56) References Cited

U.S. PATENT DOCUMENTS

| | | |
|---|---|---|
| 7,440,732 B2 | 10/2008 | Pan |
| 10,135,472 B1 | 11/2018 | Othman |
| 10,567,063 B1 | 2/2020 | Bakeer et al. |
| 2016/0204828 A1* | 7/2016 | Jackson ............... H04B 3/30 375/257 |
| 2019/0190451 A1* | 6/2019 | D'Alessandro ....... H03B 27/00 |
| 2020/0067475 A1* | 2/2020 | Kearney ............... H03L 7/095 |
| 2021/0083782 A1* | 3/2021 | Jones ................ H03L 7/0891 |
| 2021/0203369 A1* | 7/2021 | Kasargod ........... H04B 1/0475 |
| 2021/0242894 A1* | 8/2021 | de Ruijter ........... H04B 1/1638 |
| 2021/0399690 A1* | 12/2021 | Panseri ................ H03F 3/19 |
| 2022/0173946 A1* | 6/2022 | Wu .................... H03L 7/23 |
| 2022/0201603 A1* | 6/2022 | Klein ............... H04L 27/0002 |

OTHER PUBLICATIONS

International Search Report and Written Opinion dated Oct. 17, 2022, in corresponding PCT International Appl. No. PCT/US2022/034608, 9 pages.

* cited by examiner

*Primary Examiner* — Thanh C Le
(74) *Attorney, Agent, or Firm* — Haynes and Boone, LLP (57) ABSTRACT

A transceiver is configured for a calibration mode of operation in which an impedance of a transmit chain is tuned responsive to a power measurement of a mixed RF calibration signal to form a tuned transmit chain. A direct conversion mixes an RF calibration signal with a DC offset signal to form the mixed calibration signal. During a normal mode of operation, a heterodyne mixer mixes an LO signal with an IF signal to produce an RF signal that is amplified through the tuned transmit chain.

27 Claims, 9 Drawing Sheets

TRANSCEIVER DROOP CALIBRATION

TECHNICAL FIELD

This application relates to radio frequency applications, and more particularly to a radio frequency (RF) transceiver with droop calibration.

BACKGROUND

A superheterodyne transceiver offers a number of advantages over a direct conversion transceiver such as improved tuning and filtering at the intermediate frequency (IF). But a superheterodyne also has disadvantages as compared to a direct conversion transceiver. For example, the up conversion in frequency from IF to a radio frequency (RF) in a superheterodyne transceiver may introduce spurs in the spectrum for the transmitted RF signal. The resulting production of such spurs may increase challenges for satisfying a spectral emissions mask (SEM) requirement for the superheterodyne transceiver.

To reduce or mitigate the spurs, a superheterodyne transceiver may include various tunable capacitors in its transmitter amplifier chain. Although the added capacitance from the tunable capacitors reduces the spurs so that the spectral emission mask may be satisfied, this extra capacitance may cause an undesirable reduction (droop) in the amplitude of the transmitted RF signal. It is thus problematic to configure the various nodes in the transmitter amplifier chain with the proper amount of capacitance to satisfy the spectral emission mask without causing undesirable droop.

SUMMARY

In accordance with an aspect of the disclosure, a transmitter is provided that includes: a transmit chain including at least one amplifier; a first mixer configured to mix an intermediate frequency signal and a local oscillator signal to form a radio frequency data signal at an input of the transmit chain; a signal multiplier configured to mix the local oscillator signal with a frequency-translated version of the local oscillator signal to form an RF calibration signal; and a second mixer configured to mix the RF calibration signal with a DC offset signal to form a mixed RF calibration signal at the input of the transmit chain.

In accordance with another aspect of the disclosure, a transmitter is provided that includes: a transmit chain including at least one amplifier; a mixer having an output coupled to an input of the transmit chain; a signal multiplier configured to generate an RF calibration signal; and a set of switches having a first switching state in which an intermediate frequency signal and a local oscillator signal are routed to the mixer and having a second switching state in which a DC offset signal and the RF calibration signal are routed to the mixer.

In accordance with yet another aspect of the disclosure, a transmitter is provided that includes: a transmit chain including at least one amplifier; a mixer having an output coupled to an input of the transmit chain and having a first input coupled to a node for a local oscillator signal; a first switch configured to selectively couple an intermediate frequency signal to the mixer; and a second switch configured to selective couple a frequency-translated version of the local oscillator signal to the mixer.

Finally, in accordance with another aspect of the disclosure, a method of operation for a transceiver is provided that includes: during a calibration mode of operation: mixing an LO signal with a frequency-translated version of the LO signal to form an RF calibration signal; mixing the RF calibration signal with a DC offset signal to form a mixed RF calibration signal; amplifying the mixed RF calibration signal through a transmit chain in the transceiver to form an amplified mixed RF calibration signal; and adjusting an impedance of the transmit chain responsive to a power measurement of the amplified mixed RF calibration signal to form a tuned transmit chain; during a normal mode of operation: mixing the LO signal with an intermediate frequency signal to form an RF signal; and amplifying the RF signal through the tuned transmit chain.

These features and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A heterodyne transceiver is provided that advantageously employs a calibration mode of operation that mitigates output signal droop. In a first implementation, the transceiver uses a direct conversion mixing in which an RF calibration signal is mixed with a DC offset signal to produce a mixed RF calibration signal. A transmit chain in a transmitter portion of the transceiver amplifies the mixed RF calibration signal during the calibration mode of operation so that a power detector may measure the power spectrum of the amplified mixed RF calibration signal at one or more nodes in the transmit chain as a frequency of the RF calibration signal is swept across a desired output band. Based upon the power spectrum, a controller tunes an impedance of the transmit chain (e.g., a transmit chain capacitance). For example, the controller may tune the transmit chain capacitance to improve a symmetry of the power spectrum. Although the RF calibration signal is generated through a heterodyne mixing, the direct conversion mixing provides an inherent filtering of spurs generated from this heterodyne mixing. The resulting power spectrum is thus substantially free of spurs such as at twice the local oscillator frequency (2LO), twice the local oscillator frequency minus the intermediate frequency (2LO−IF), and the local oscillator frequency minus the intermediate frequency (LO−IF) that would otherwise pollute the power spectrum. If the spurs are present in the power spectrum, the resulting tuning of the transmit chain capacitance may result in an excessive transmit chain capacitance that causes the RF output signal during a normal mode of operation to suffer from a undesirably reduced amplitude (droop).

In a second implementation, heterodyne mixing produces the mixed RF calibration signal during the calibration mode of operation. Although direct conversion mixing is not used in the second implementation, spurs are still reduced by the heterodyning of an oscillator signal (e.g., a voltage-controlled oscillator (VCO) signal) with a frequency-translated version of the oscillator signal. In contrast, the transceiver during the normal mode of operation generates an RF signal by heterodyning an intermediate frequency (IF) signal with a local oscillator (LO) signal (e.g., a frequency-translated version of the VCO signal). The transceiver generates the IF signal by mixing a baseband signal with another LO signal. If the calibration mode of operation used the heterodyning of the two distinct signals (the IF signal and the LO signal) as done during the normal mode of operation, the power measurement may again be polluted by spurs that are instead reduced by the heterodyning of the two related signals during the calibration mode of operation. Accordingly, both calibration mode implementations advantageously mitigate droop.

Transceiver Architecture

Figure 1:
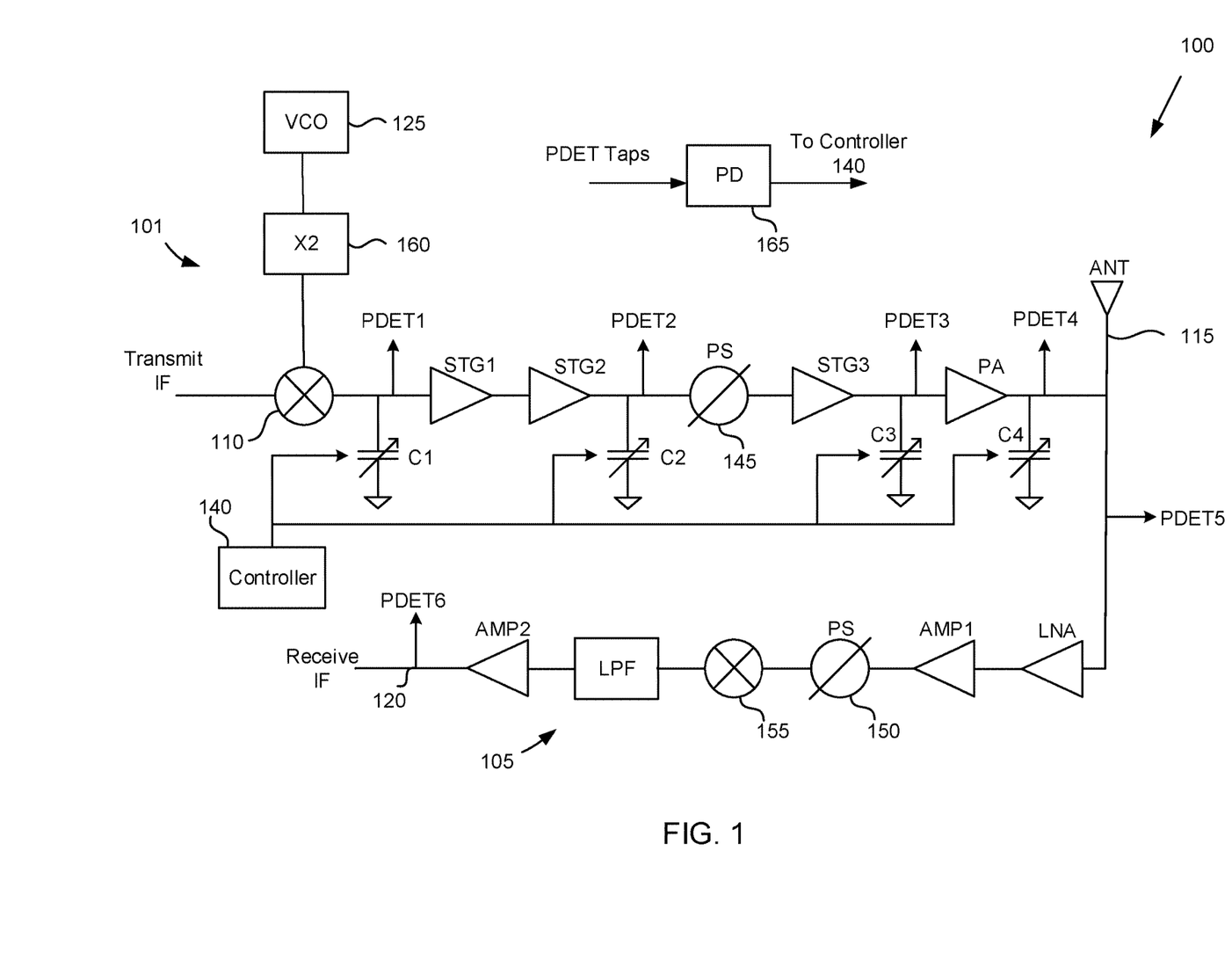
FIG. 1 illustrates an example transceiver configured for operation in both a normal and a calibration mode in accordance with an aspect of the disclosure.

An example transceiver 100 is shown in FIG. 1 that includes a portion of a transmitter transmit chain 101 and a portion of a receiver receive chain 105. Transmit chain 101 extends from a mixer 110 to an antenna (or sub-array of antennas) 115. Receive chain 105 extends from antenna 115 to a node 120 for a receive intermediate frequency (IF) signal. In transmit chain 101, a transmit IF signal is upconverted to a radio frequency (RF) signal in mixer 110 during the normal mode of operation by mixing transmit IF signal with a local oscillator (LO) signal. For example, the LO signal may be generated by a frequency doubler 160 that doubles the frequency of an output signal from a voltage-controlled oscillator (VCO) 125. Transmit chain 101 includes several amplifiers that successively amplify the RF signal such as a stage 1 (STG1) amplifier, a stage 2 amplifier (STG2), and a stage 3 amplifier (STG3). A phase shifter (PS) 145 intervenes between the STG2 and STG3 amplifiers to phase shift the RF signal such as for a beam steering as the RF signal is being amplified through the transmit chain 101. A power amplifier (PA) functions as the final amplifier in transmit chain 101 before the amplified RF signal is driven into an antenna 115.

Receive chain 105 couples to antenna 115 through an isolating device such as a circulator (not illustrated) to inhibit the receiving of the amplified RF signal from transmit chain 101 into receive chain 105. Receive chain 105 includes an initial low-noise amplifier (LNA) and an additional amplifier such as a first amplifier (AMP1) to successively amplify the received RF signal from antenna 115. To enable beam steering for the received RF signal, receive chain 105 includes a phase shifter 150 that phase shifts the amplified received RF signal from AMP1 to produce a phase-shifted RF signal that is mixed in a mixer 155 with an LO signal to down convert the phase-shifted RF signal into the receive IF signal. The receive IF signal may then be filtered such as in a low-pass filter (LPF) and amplified in a second amplifier (AMP2) for further signal processing in the receive chain 105. It will be appreciated that transceiver 100 may include a plurality of transmit chains in addition to transmit chain 101. Similarly, transceiver 100 may include a plurality of receive chains in addition to receive chain 105. Transceiver 100 may further include other circuitry for converting the IF signals to baseband for additional processing by a mode or other signal processing circuits.

Figure 2:
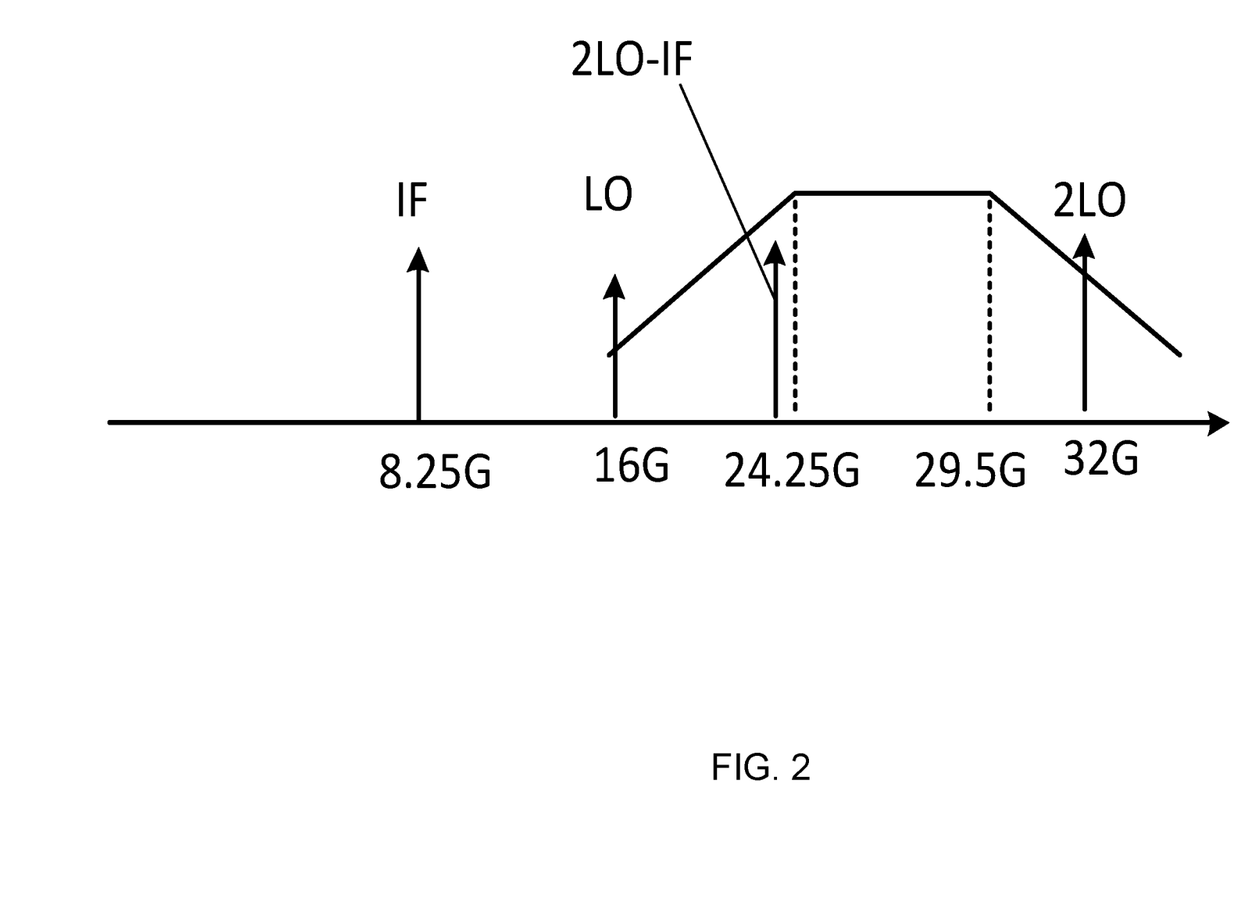
FIG. 2 illustrates an example output power spectrum for the transceiver of FIG. 1.

As noted earlier, a superheterodyne architecture such as illustrated for transceiver 100 may offer improved tuning and filtering as compared to the use of direct RF conversion. But these advantages may come at the cost of spurs affecting a spectral emission mask requirement. The production of spurs in the RF signal from mixer 110 in transmit chain 101 depends upon the IF frequency and the LO signal frequency. For example, suppose transceiver 100 is configured for operation in a millimeter band ranging from 24.25 GHz and 29.5 GHz. An example output spectrum for the transmitted RF signal from antenna 115 is shown in FIG. 2. In this implementation, the IF frequency is 8.25 GHz and the LO frequency is 16 GHz. The heterodyne mixing of these two frequencies results in a variety of spurs including one at twice the LO frequency minus the IF frequency (2LO−IF) and one at 2LO. The frequency of the 2LO−IF spur is 23.75 GHz, which is very close to the lowest band frequency of 24.25 GHz. Similarly, the 2LO frequency of 32 GHz is relatively close to the highest band frequency of 29.5 GHz. These spurs may thus pollute a power measurement of the output spectrum for transceiver 100, resulting in erroneous power measurement. For example, transmit chain 101 may have various taps at which the RF signal power is measured including a first power detection tap (PDET1) at the output of mixer 110, a second power detection tap (PDET2 at the output of the second stage amplifier STG2, a third power detection tap (PDET3) at the output of the third stage amplifier STG3, and a fourth power detection tap (PDET4) at the output of the power amplifier. These detection taps may also be denoted as nodes. A single power detector 165 may sequentially couple to these taps to measure the corresponding signal power. Alternatively, each tap may have its own separate power detector. With regard to this power detection, one could sweep the LO frequency as the output mixer 110 mixes the LO signal with the transmit IF signal so that the resulting RF signal sweeps in frequency across the output band and observe the output power spectrum at the various taps. This may be done sequentially, beginning with the first power detection tap PDET1 and ending with the fourth power detection tap PDET4. Based on the observed spectrum, an impedance of the transmit chain 101 may be adjusted. For example, the power detection taps or nodes in transmit chain 101 may also couple to corresponding tunable or adjustable capacitors. The output of the mixer 110 may couple to a tunable capacitor C1, the output of the stage 2 amplifier STG2 may couple to a tunable capacitor C2, the output of the stage 3 amplifier STG3 may couple to a tunable capacitor C3, and the output of the power amplifier may couple to a tunable capacitor C4. A controller 140 controls the tuning of these tunable capacitors based upon the power measurements.

The tuning may be performed in various fashions. In one implementation, controller 140 may analyze the output power spectrum measured from the first power detection tap PDET1 and adjust the capacitance of tunable capacitor C1 until the output power is substantially symmetric across the output band. This capacitance value or tuning signal may then be stored so it may be used during a normal mode of operation. Referring to again to the example spectrum of FIG. 2, it may be undesirable for the output power at the low end of the output band to be substantially different from the output power at the high end (in this example, the low end is 24.25 GHz and the high end is 29 GHz). Controller 140 may thus tune tunable capacitor C1 until the output power spectrum from the first power detection tap PDET1 is sufficiently symmetric. Controller 140 may then tune tunable capacitor C2 based upon the output power spectrum from the second power detection tap PDET2. Controller 140 may then tune tunable capacitor C3 based upon the output power spectrum from the third power detection tap PDET3. Finally, controller 140 may tune tunable capacitor C4 based upon the output power spectrum from the fourth power detection tap PDET4 to complete the tuning of transmit chain 101 so that transmit chain 101 forms a tuned transmit chain that would then be used in the normal mode of operation. The resulting capacitance values or tuning signals for capacitors C2, C3, and C4 may also be stored so that capacitors C2, C3, and C4 may be configured accordingly during the normal mode of operation following calibration.

Direct Conversion Implementations of the Calibration Mode of Operation

Figure 3A:
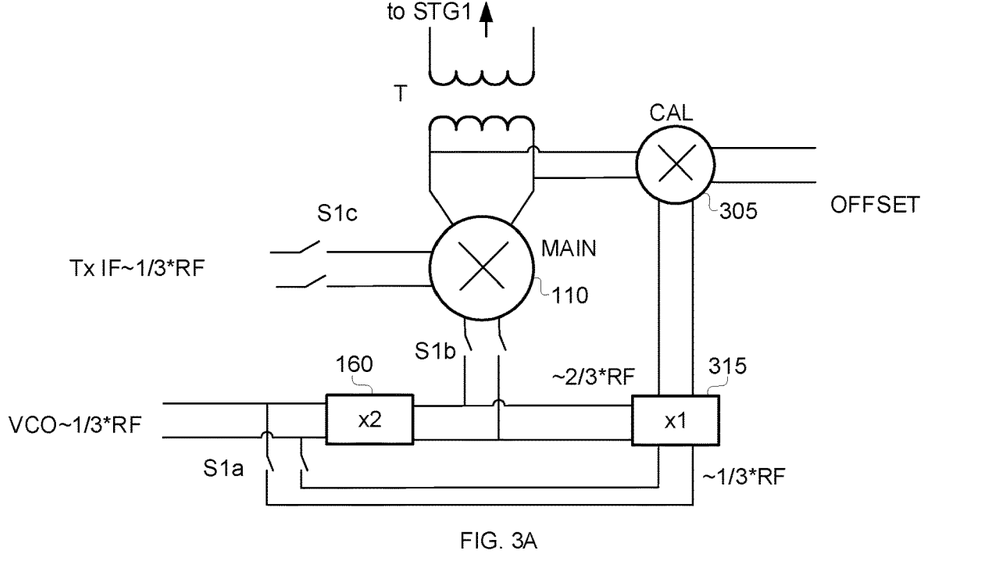
FIG. 3A illustrates a portion of the transmit chain in the transceiver of FIG. 1 in which the calibration mode of operation uses a separate direct conversion mixer in accordance with a first aspect of the disclosure.

The power measurements just described may be polluted by the spurs introduced by the heterodyning in mixer 110 of the LO and transmit IF signals. Based upon this extra power contributed by the spurs, controller 140 may adjust the tunable capacitors such that excessive capacitance is added that causes the amplitude of the transmitted RF signal to undesirably droop such as at the low and high end of the output spectrum. Controller 140 also controls the LO signal frequency so that the frequency of the mixed RF calibration signal is swept across the desired output spectrum of transceiver 100 during the calibration mode of operation. To more accurately tune the tunable capacitors and mitigate the droop, transmit chain 101 may be modified to include a direct conversion mixer 305 as shown in FIG. 3A. Mixer 110 will thus also be denoted herein as a main mixer 110 to distinguish it from the direct conversion mixer 305. It will be appreciated that main mixer 110 and direct conversion mixer 305 may also be implemented as single-ended mixers. The following discussion will thus be directed to differential implementations without loss of generality. Frequency doubler 160 and main mixer 110 operate during the normal mode of operation as discussed for FIG. 1. During the normal of operation, a switch S1c and S1b both close so that main mixer 110 receives both the transmit IF signal and an LO signal. Main mixer then multiplies the transmit IF signal and the LO signal during the normal mode of operation to drive the first stage amplifier STG1 (not shown in FIG. 3A) through a transformer T with an RF signal. The remaining portion of transmit chain 101 is not shown in FIG. 3A for illustration clarity but may be arranged as discussed for transceiver 100. In this implementation, the VCO frequency is approximately ⅓ the frequency of the RF signal produced by main mixer 110. The frequency of the transmit IF signal is also approximately ⅓ the frequency of the RF signal (this frequency is also denoted as RF in the following discussion). Since doubler 160 doubles the VCO frequency to produce the LO signal, the LO signal frequency is approximately ⅔RF. The mixing in main mixer 110 between the ⅓ RF transmit IF signal and the ⅔ RF LO signal will thus produce the RF signal at the RF frequency during the normal mode of operation.

During a calibration mode of operation, main mixer 110 is bypassed by opening of switches S1b and S1c. In addition, a switch S1a closes during the calibration mode of operation to couple the VCO signal to a signal multiplier 315. Signal multiplier 315 functions to multiply the VCO signal with the LO signal from frequency doubler 160 to produce an RF calibration signal that oscillates at the RF frequency. Since the RF frequency is stepped up by the VCO frequency over the LO signal frequency, signal multiplier 315 may be deemed to be a one-time (×1) multiplier. In contrast, frequency doubler 160 may be deemed to be a two-time (×2) multiplexer since it doubles the VCO frequency to produce the LO signal. Frequency doubler 160 is an example of a frequency multiplier that may produce other multiples of the VCO frequency besides just a frequency doubling in alternative implementations.

The RF calibration signal is mixed in direct conversion mixer 305 with a DC offset signal during the calibration mode of operation to produce a mixed RF calibration signal that is unchanged in frequency from the RF calibration signal. Direct conversion mixer 305 may also be denoted as a calibration mixer (CAL). As the VCO frequency is swept from one-third the lowest frequency for the output band to one-third of the highest frequency of the output band during the calibration mode operation, the mixed RF calibration signal that is amplified through transmit chain 101 will have its frequency sweep across the output band. The calibration of the tunable capacitors may then be determined based on the power measurements of the mixed RF calibration signal as it is amplified through the transmit chain. Since the spurs are suppressed for the mixed RF calibration signal due to the direct conversion in direct conversion mixer 305, the resulting calibration is more accurate as compared to calibration using heterodyne mixing such as occurs in main mixer 110 during the normal mode of operation. The capacitance values for the tunable capacitors may then be set more accurately during the normal mode of operation since the calibration was not as affected by spurs. In addition, the multiplication in signal multiplier 315, although it is a heterodyne mixing of the VCO signal with the LO signal, may advantageously produce less spurs as compared to the comparable heterodyne mixing in main mixer 110 due to the simplified construction of signal multiplier 315 as compared to main mixer 110. Main mixer 110 may also be denoted as a first mixer. Similarly, direct conversion mixer 305 may also be denoted as a second mixer.

Figure 3B:
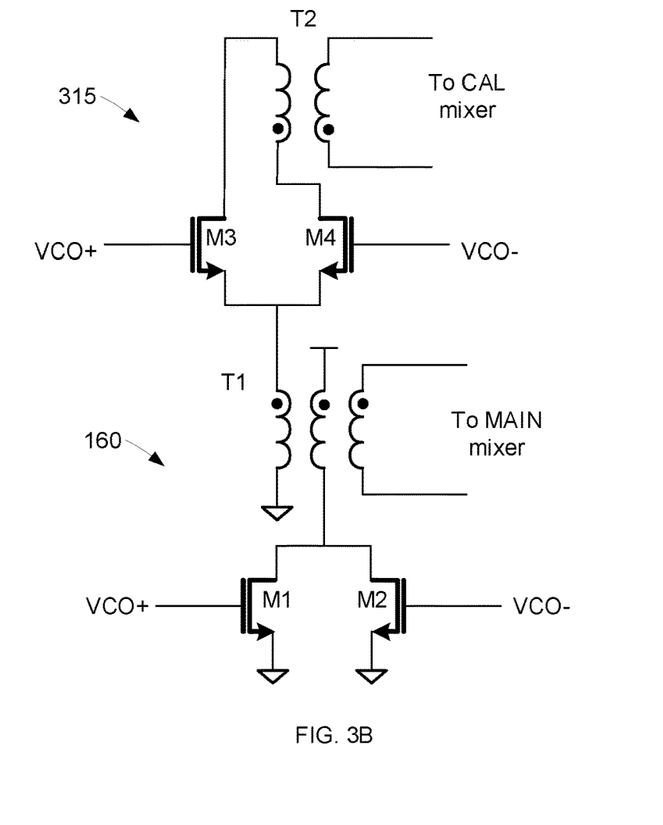
FIG. 3B illustrates a circuit diagram for the frequency doubler and the signal multiplier in the transmit chain of FIG. 3A.

An example construction for signal multiplier 315 and frequency doubler 160 is shown in FIG. 3B. Frequency doubler 160 includes a matched pair of n-type metal-oxide semiconductor (NMOS) transistors M1 and M2 that have their drains connected together at a common drain node and having their sources connected to ground (or some reference potential functioning as ground). The positive component of the VCO signal drives the gate of transistor M1 whereas the negative component of the VCO signal drives the gate of transistor M2. The drains of transistors M1 and M2 are connected to a first coil in a tri-coil transformer T1. A second coil of transformer T1 connects to an input terminal of the main mixer 110. A third coil of transformer T1 couples to the drains of a differential pair of transistors M3 and M4 in signal multiplier 315. Transformer T1 is biased by the operation of transistors M1 and M2 so that it operates non-linearly to provide the frequency doubling of frequency doubler 160.

Due to the frequency doubling in frequency doubler 160, a drain current to the differential pair of transistors M3 and M4 in signal multiplier 315 oscillates at twice the VCO frequency. The drain of transistor M3 connects to a first terminal of a first coil in a transformer T2 in signal multiplier 315. Similarly, the drain of transistor M4 connects to a second terminal of the first coil in transformer T2. The positive component of the VCO signal drives the gate of transistor M3 whereas the negative component of the VCO signal drives the gate of the transistor M4. The differential action of the differential pair of transistors M3 and M4 in steering their drain current that oscillates at twice the VCO frequency will thus cause a current through the first coil of transformer T2 to oscillate at the RF frequency (three times the VCO frequency). A remaining second coil of transformer T2 couples to an input terminal of calibration mixer 305.

Figure 4A:
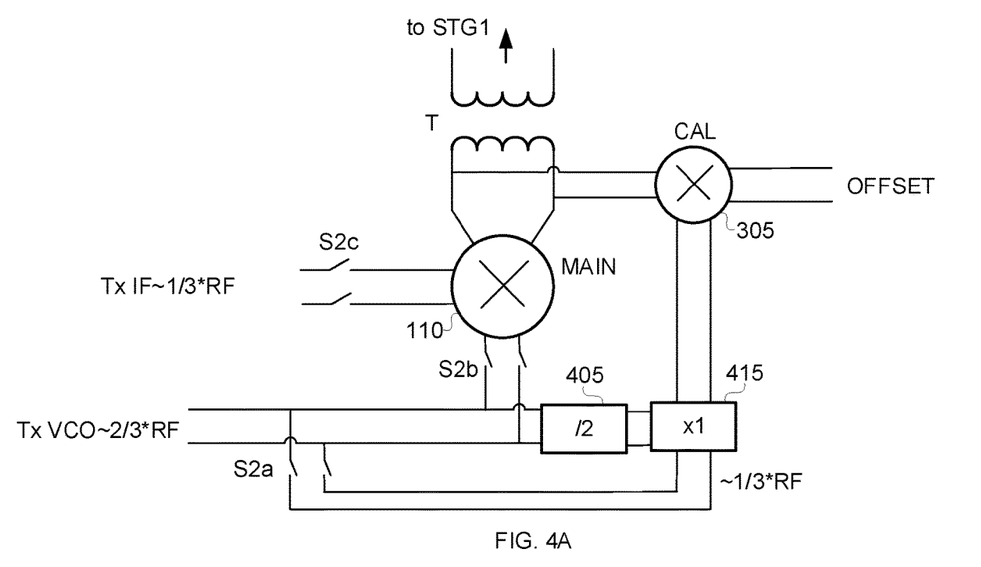
FIG. 4A illustrates a portion of the transmit chain in the transceiver of FIG. 1 in which the calibration mode of operation uses a separate direct conversion mixer in accordance with a second aspect of the disclosure.

The direct conversion and resulting accurate power measurements and tuning of the tunable capacitors in a transmit chain may be practiced by a variety of alternative implementations. For example, suppose that the VCO frequency is two-thirds of the RF frequency such that frequency doubler 160 may be omitted from the transmit chain. The VCO output signal directly forms the LO signal in such an implementation. As shown in FIG. 4A, main mixer 110 mixes the LO signal with the transmit IF signal during the normal mode of operation. During the normal mode of operation, a switch S2c and a switch S2b both close so that main mixer receives the LO and transmit IF signals. The transmit IF signal couples through switch S2c to an input port of main mixer 110 during the normal mode of operation. At the same time, the LO signal couples to another input terminal of main mixer 110 through switch S2b. A switch S2a is opened to isolate an input terminal of a signal multiplier 415 from the LO signal during the normal mode of operation. In contrast, switch S2a closes during the calibration mode of operation so that the LO signal may be multiplied in signal multiplier 415 to form the RF calibration signal that is then mixed with the DC offset in calibration mixer 305 to form the mixed RF calibration signal as discussed analogously with regard to FIG. 3A. Switches S2b and S2c are open during the calibration mode of operation to isolate the input terminals of main mixer 110 from the LO and transmit IF signals. During the calibration mode of operation, a divide-by-two frequency divider 405 reduces the LO signal to the IF frequency so that signal multiplier 415 may increase the LO signal frequency by the IF frequency to produce the RF calibration signal. The RF calibration signal frequency may then be swept across the output band so that the power measurements and tuning of the tunable capacitors may be performed with a substantially-spur-free tone as discussed with regard to FIG. 3A.

Figure 4B:
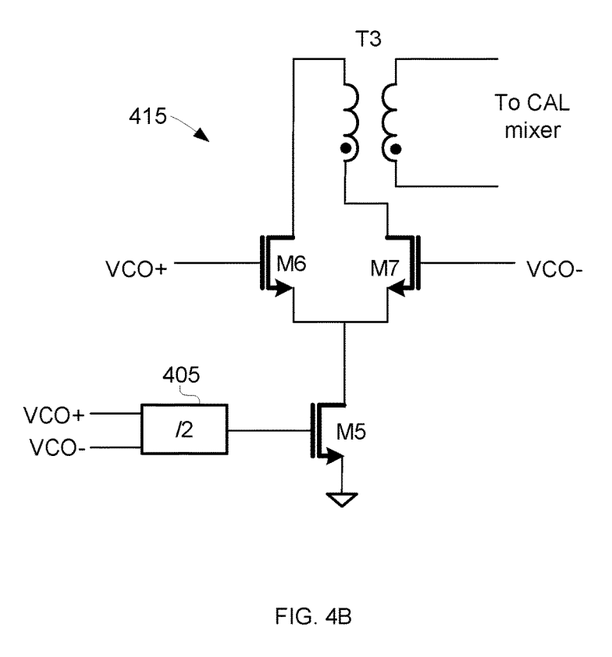
FIG. 4B illustrates a circuit diagram for the signal multiplier in the transmit chain of FIG. 4A.

An example implementation of signal multiplier 415 is shown in FIG. 4B. The divided output signal from frequency divider 405 drives a gate of an NMOS transistor M5 in signal multiplier 415. The source of transistor M5 connects to ground whereas its drain connects to the drains of a differential pair of NMOS transistors M6 and M7. The positive component of the VCO signal drives a gate of differential pair transistor M6 whereas the negative component of the VCO signal drives a gate of differential pair transistor M7. The differential pair of transistors M6 and M7 are arranged with respect to a first coil in a transformer T3 analogously as discussed for the differential pair of transistors M3 and M4. A remaining second coil of transformer T3 couples to an input terminal of the calibration mixer 305. The tail current to the differential pair of transistors M6 and M7 oscillates at the IF frequency (one-third of RF) so that the multiplication with the VCO frequency (two-thirds of RF) produces a mixed RF calibration signal that oscillates at the RF frequency to drive the calibration mixer 305.

Figure 5:
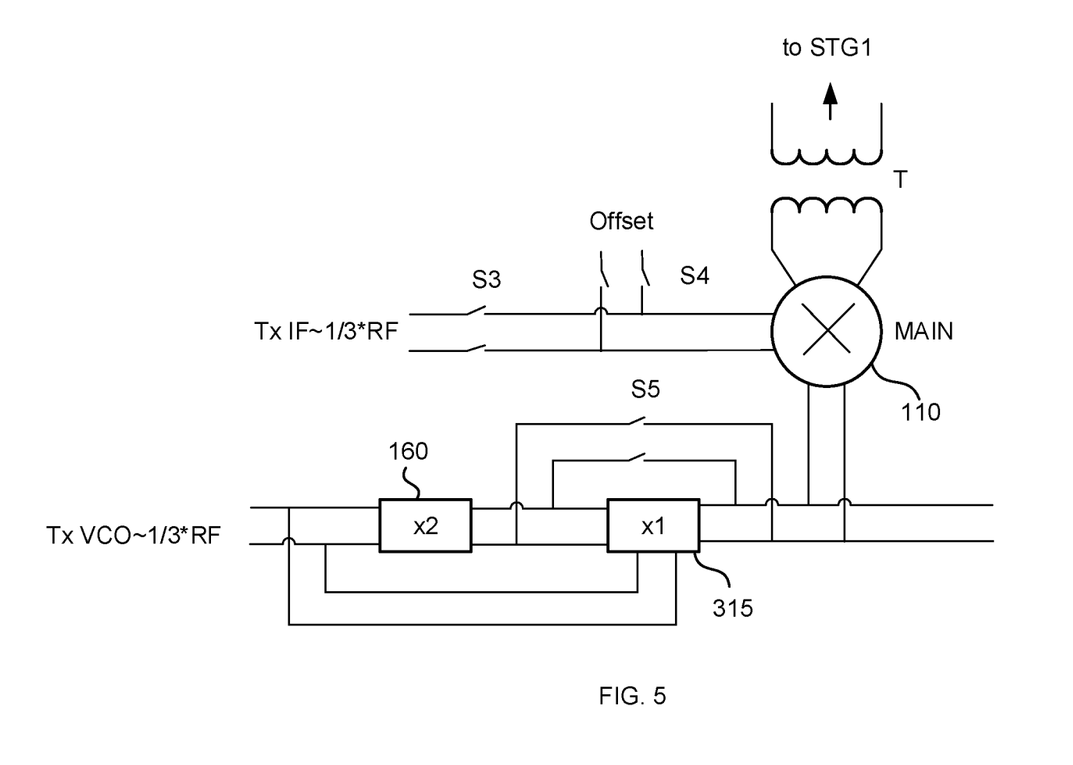
FIG. 5 illustrates a portion of the transmit chain in the transceiver of FIG. 1 in which the main mixer is used as a direct conversion mixer during the calibration mode of operation in accordance with an aspect of the disclosure.

In yet another direct conversion implementation, the main mixer 110 may be configured to operate as a heterodyne mixer during the normal (mission) mode of operation and as a direct conversion mixer during the calibration mode of operation. In this fashion, density is increased as a separate direct conversion mixer is not needed yet the calibration mode of operation still enjoys the spur-filtering features of direct conversion responsive to mixing the RF calibration signal with a DC offset signal. Although density is increased by the use of a separate calibration mixer, the simpler construction of the calibration mixer may advantageously produce fewer spurs as compared to the re-use of the main mixer for calibration. An example implementation in which the main mixer is reused for calibration is shown in FIG. 5. In this implementation, the VCO signal frequency is one-third the RF frequency so the VCO signal is doubled in frequency doubler 160 during the normal mode of operation to produce the LO signal at two-thirds the RF frequency. A pair of switches S5 are closed during the normal mode of operation so that the LO signal bypasses the signal multiplier 315. A pair of switches S3 are also closed during the normal mode of operation so that the transmit IF signal may be heterodyned in main mixer 110 with the LO signal to produce the RF signal. Note that the beginning element in the transmit chain that will be driven during both the normal and calibration modes by the mixing alternatives discussed herein is designated in FIGS. 3A, 4A, and 5-7 as the stage 1 amplifier to be consistent with transmit chain 101. However, it will be appreciated that the transmit chain implementation may be varied in alternative implementations such that the stage 1 amplifier may be replaced with whatever is the element at the input node of a particular transmit chain implementation after main mixer 110.

In the calibration mode of operation, switches S5 are opened so that the LO signal may be multiplied in signal multiplier 315 with the VCO signal to produce the RF calibration signal. Switches S3 are opened and a pair of switches S4 are closed during the calibration mode of operation so that the DC offset signal may be mixed with the RF calibration signal in main mixer 110 to produce the mixed RF calibration signal. Main mixer 110 is thus advantageously functioning as a direct conversion mixer during the calibration mode of operation During the normal mode of operation, switches S4 are open to isolate the DC offset signal from the main mixer 110.

The RF calibration signal may be produced in a variety of fashions as discussed regarding FIGS. 3A, 4A, and 5. In all these cases, the RF calibration signal may be deemed to be formed by a mixing of the LO signal with a frequency-translated version of the LO signal. For example, the VCO signal is doubled to form the LO signal in FIG. 3A. In that case, the VCO signal may be deemed to be a frequency-translated version of the LO signal as the VCO frequency is one-half the LO frequency. Signal multiplier 315 then functions to multiply (mix together) the LO signal with a frequency-translated version of the LO signal to form the RF calibration signal. Similarly, the VCO signal functions as the LO signal in FIG. 4A. This LO signal is then divided by two in frequency by frequency divider 405 to form the frequency-translated version of the LO signal that is multiplied by the LO signal in signal multiplier 415 to form the RF calibration signal. Finally, the VCO signal is doubled in frequency to form the LO signal in FIG. 5. As just discussed for FIG. 3A, the VCO signal may thus be deemed to be a frequency-translated version of the LO signal as the VCO frequency is one-half the LO frequency. Signal multiplexer 315 in FIG. 5 again functions to multiply the LO signal with a frequency-translated version of the LO signal to form the RF calibration signal.

Heterodyne Implementations of the Calibration Mode of Operation

Figure 6:
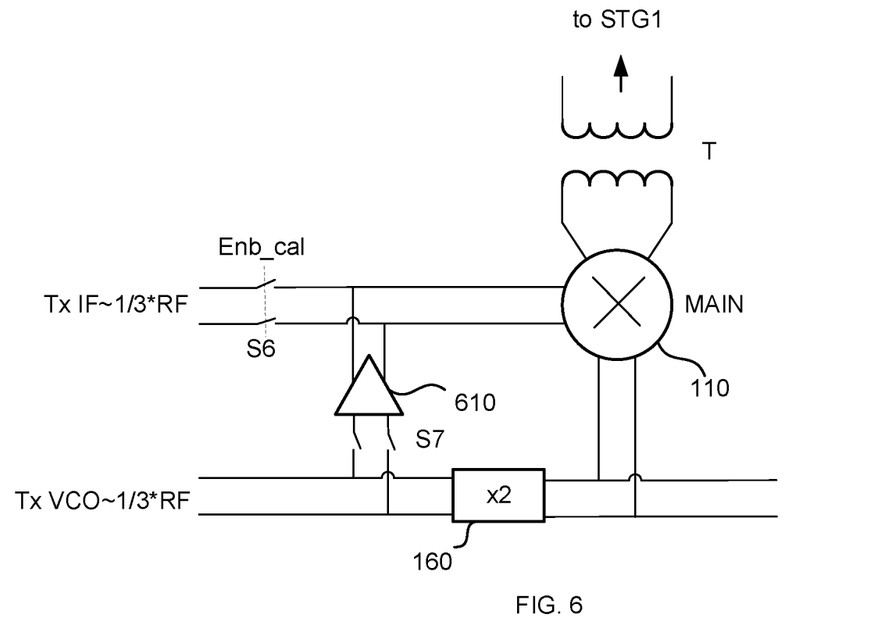
FIG. 6 illustrates a portion of the transmit chain in the transceiver of FIG. 1 in which the calibration mode of operation does not use direct conversion mixing in accordance with a first aspect of the disclosure.

In some implementations, heterodyne mixing generates the RF calibration signal during the calibration mode of operation. Although no direct conversion filtering of spurs then occurs, the spur production may be reduced by multiplying the VCO signal with the LO signal (which in turn is a frequency-translated version of the VCO signal) during the calibration mode of operation instead of heterodyning the LO signal with the IF signal as occurs during the normal mode of operation. More specifically, if a heterodyne transceiver uses a frequency plan in which LO=⅔*RF and IF=⅓*RF, the 2LO–IF spur may be exactly at RF. This results in a fixed error term in power measurement across the band of interest and therefore may be taken out from the overall measurement error. But if other spurs such as 2*LO are present and significant at the frequency of interest, then direct-conversion-based calibration may be used instead of heterodyne-based calibration. An example heterodyne implementation in which the VCO frequency is one-third the RF frequency is shown in FIG. 6. During the normal mode of operation, an enable calibration signal (Enb_cal) is false so that a pair of switches S6 are closed to drive the main mixer 110 with the transmit IF signal. A pair of switches S7 are open during the normal mode of operation. The VCO signal is doubled in frequency doubler 160 during both the normal and calibration modes of operation to form the LO signal. In the calibration mode of operation, switches S6 open and switches S7 close so that the VCO signal may be multiplied in the main mixer with the LO signal. Since the VCO frequency is one-third the RF frequency, the LO signal frequency is two-thirds of the RF frequency. The multiplication in the main mixer 110 during the calibration mode of operation will thus produce a mixed RF calibration signal at the RF frequency. The VCO signal is then tuned so that the frequency of the mixed RF calibration signal sweeps across the RF output band. The output power spectrum may then be measured and the capacitance of the transmit chain adjusted as discussed earlier. In some embodiments, an amplifier 610 may be used to boost the VCO signal before it is multiplied in main mixer 110 during the calibration mode of operation.

Figure 7:
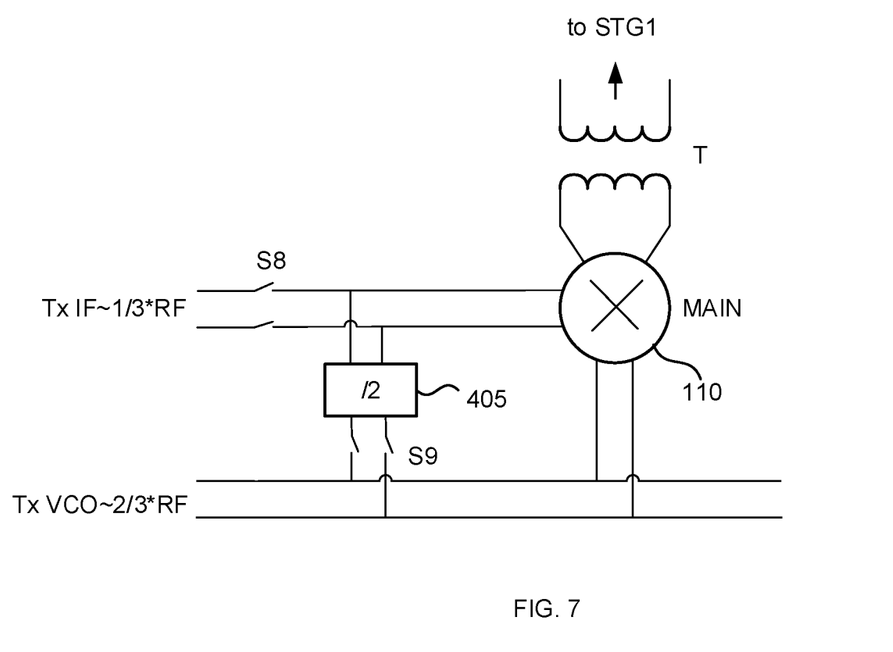
FIG. 7 illustrates a portion of the transmit chain in the transceiver of FIG. 1 in which the calibration mode of operation does not use direct conversion mixing in accordance with a second aspect of the disclosure.

An example heterodyne implementation in which the VCO frequency is two-thirds the RF frequency is shown in FIG. 7. In such an implementation, the VCO signal is the LO signal so there is no frequency doubling. During the normal mode of operation, the VCO signal is heterodyned with the transmit IF signal in main mixer 110 to produce the RF signal for the transmit chain. A pair of switches S8 are closed during the normal mode of operation to allow the transmit IF signal to couple to the main mixer 110. In a transition to the calibration mode of operation, switches S8 open and a pair of switches S9 close. Switches S9 couple the VCO signal to the divide-by-two frequency divider 405 to produce a frequency-translated version of the LO signal that oscillates at one-third the RF frequency. Main mixer 110 then heterodynes the frequency-translated version of the LO signal and the LO signal to create the mixed RF calibration signal that drives the transmit chain.

Example Methods of Operation

Figure 8:
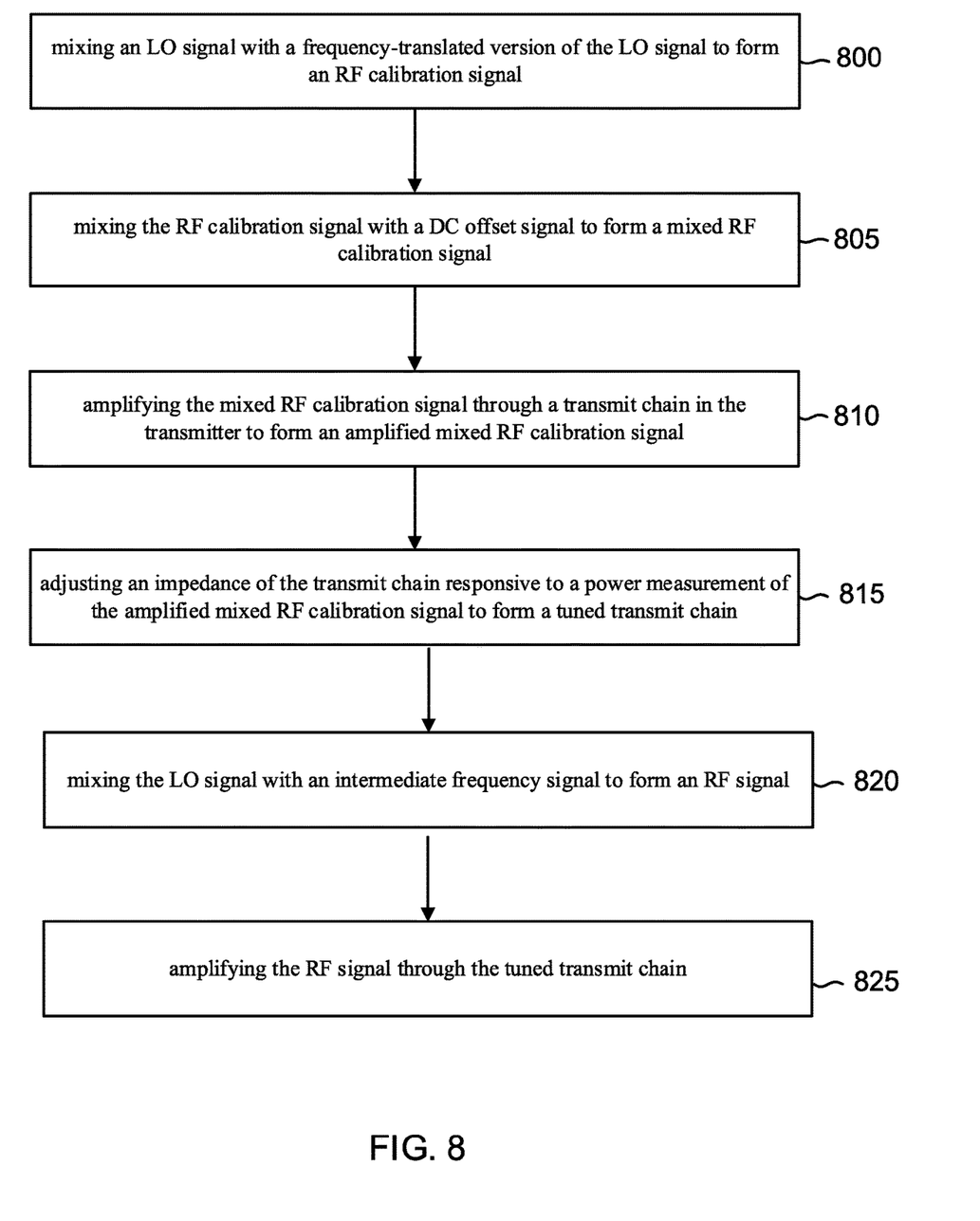
FIG. 8 is a flowchart for an example method of operation for a transceiver with a direct conversion implementation of the calibration mode of operation in accordance with an aspect of the disclosure.

An example method of operation for a transceiver with a direct conversion implementation of the calibration mode of operation will now be discussed with reference to the flowchart of FIG. 8. The method includes a set of acts 800, 805, 810, and 815 that occur during the calibration mode of operation. Act 800 includes mixing an LO signal with a frequency-translated version of the LO signal to form an RF calibration signal. The mixing of the LO signal with the VCO signal in signal multiplier 315 as discussed regarding FIGS. 3A and 5 is an example of act 800. Similarly, the mixing of the VCO signal with the frequency-divided-by-two version of the VCO signal in signal multiplier 415 as discussed regarding FIG. 4A is an example of act 800.

Act 805 includes mixing the RF calibration signal with a DC offset signal to form a mixed RF calibration signal. The mixing in calibration mixer 305 as discussed with regard to FIGS. 3A and 4A and the mixing in main mixer 110 (during the calibration mode of operation) as discussed with regard to FIG. 5 are all examples of act 805. Act 810 includes amplifying the mixed RF calibration signal through a transmit chain in the transmitter to form an amplified mixed RF calibration signal. The amplification of the mixed RF calibration signal through transmit chain 101 is an example of act 810. Finally, act 815 includes adjusting an impedance of the transmit chain responsive to a power measurement of the amplified mixed RF calibration signal to form a tuned transmit chain. The tuning by controller 140 of tunable capacitors C1, C2, C3, and C4 is an example of act 815.

The method also includes acts 820 and 825 that occur during the normal mode of operation. Act 820 includes mixing the LO signal with an intermediate frequency signal to form an RF signal. The mixing in main mixer 110 during the normal mode of operation as discussed for FIGS. 3A, 4A, and 5 are examples of act 820. Finally, act 825 includes amplifying the RF signal through the tuned transmit chain. The amplification of the RF signal through the tuned transmit chain 101 during the normal mode of operation is an example of act 825.

Figure 9:
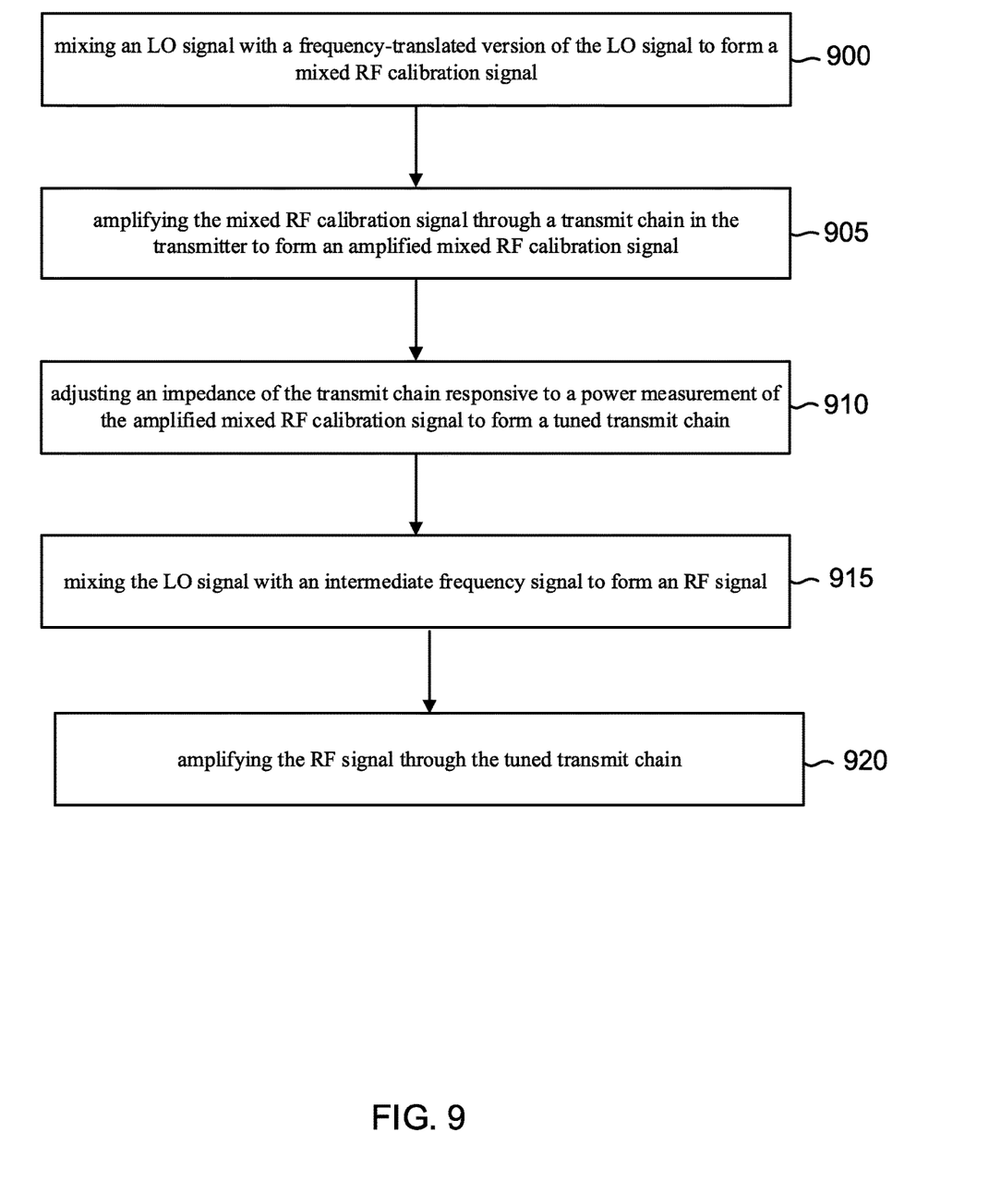
FIG. 9 is a flowchart for an example method of operation for a transceiver with a heterodyne mixing implementation of the calibration mode of operation in accordance with an aspect of the disclosure.

An example method of operation for a transceiver with a heterodyne mixer implementation of the calibration mode of operation will now be discussed with reference to the flowchart of FIG. 9. The method includes a set of acts 900, 905, and 910 that occur during the calibration mode of operation. Act 900 includes mixing an LO signal with a frequency-translated version of the LO signal to form an RF calibration signal. The mixing of the LO signal with the VCO signal in main mixer 110 as discussed with regard to FIGS. 6 and 7 is an example of act 900.

Act 905 includes amplifying the mixed RF calibration signal through a transmit chain in the transmitter to form an amplified mixed RF calibration signal. The amplification of the mixed RF calibration signal (as produced in either of FIGS. 6 and 7) through transmit chain 101 is an example of act 905. Finally, act 910 includes adjusting an impedance of the transmit chain responsive to a power measurement of the amplified mixed RF calibration signal to form a tuned transmit chain. The tuning by controller 140 of tunable capacitors C1, C2, C3, and C4 is an example of act 910.

The method also includes acts 915 and 920 that occur during the normal mode of operation. Act 915 includes mixing the LO signal with an intermediate frequency signal to form an RF signal. The mixing in main mixer 110 during the normal mode of operation as discussed for FIGS. 6 and 7 are examples of act 915. Finally, act 920 includes amplifying the RF signal through the tuned transmit chain. The amplification of the RF signal through the tuned transmit chain 101 during the normal mode of operation is an example of act 920.

Receiver Gain and Calibration

Referring again to FIG. 1, the generation of the amplified mixed RF calibration signal during the calibration mode of operation may be advantageously to measure a gain of receive chain 105. The amplified mixed RF calibration signal from one transmit chain 101 may be received by another receive chain 105 and the received power measured such as at the input to the receive chain 105 (a PDET5 measurement) and at the node 120 for the output of the receive chain 105 (the receive IF signal) though a PDET6 power measurement.

Figure 10:
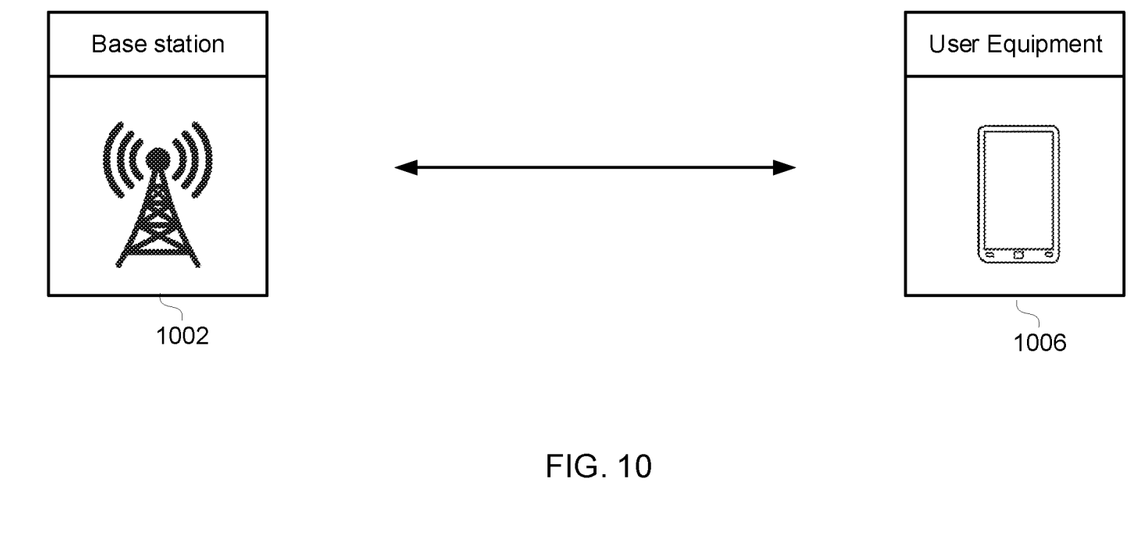
FIG. 10 illustrates an example wireless communication system in which the transceivers practice droop calibration in accordance with an aspect of the disclosure.

A transceiver with droop calibration as disclosed herein may be included in a wide variety of communication systems and protocols. An example system 1000 including a base station 1002 and a user equipment 1006 is shown in FIG. 10. Both base station 1002 and user equipment 1006 may include a transceiver configured to practice droop calibration as disclosed herein. System 1000 may practice a wide variety of wireless communication protocols such as Long Term Evolution or Fifth Generation New Radio.

The disclosure will now be summarized in the following example clauses:

Clause 1. A transmitter, comprising:
 a transmit chain including at least one amplifier;
 a first mixer configured to mix an intermediate frequency signal and a local oscillator signal to form a radio frequency data signal at an input of the transmit chain;
 a signal multiplier configured to mix the local oscillator signal with a frequency-translated version of the local oscillator signal to form an RF calibration signal; and
 a second mixer configured to mix the RF calibration signal with a DC offset to form a mixed RF calibration signal at the input of the transmit chain.

Clause 2. The transmitter of clause 1, further comprising:
 a first switch configured to selectively couple the intermediate frequency signal to the first mixer.

Clause 3. The transmitter of clause 2, wherein the frequency-translated version of the local oscillator signal comprises a voltage-controlled oscillator signal, the transmitter further comprising:
 a frequency multiplier configured to generate the local oscillator signal from the voltage-controlled oscillator signal; and
 a second switch configured to couple the voltage-controlled oscillator signal to the signal multiplier.

Clause 4. The transmitter of clause 3, wherein the frequency multiplier comprises a frequency doubler, and wherein the first switch is configured to close during a normal mode of operation and to open during a calibration mode of operation, and wherein the second switch is configured to open during the normal mode of operation and to close during the calibration mode of operation.

Clause 5. The transmitter of clause 2, further comprising:
 a frequency divider configured to divide the local oscillator signal to form the frequency-translated version of the local oscillator signal; and
 a second switch configured to selectively couple the local oscillator signal to the signal multiplier.

Clause 6. The transmitter of clause 5, wherein the frequency divider comprises a divide-by-two frequency divider, and wherein the first switch is configured to close during a normal mode of operation and to open during a calibration mode of operation, and wherein the second switch is configured to open during the normal mode of operation and to close during the calibration mode of operation.

Clause 7. The transmitter of clause 4, wherein the voltage-controlled oscillator signal is a differential signal including a positive component and a negative component, and wherein the frequency doubler comprises:
 a first transistor having a source coupled to ground, a drain connected to a common drain node and a gate coupled to the positive component; and
 a second transistor having a source coupled to ground, a drain connected to the common drain node and a gate coupled to the negative component.

Clause 8. The transmitter of clause 7, further comprising:
 a transformer, wherein the signal multiplier comprises a differential pair of transistors having a common source node coupled to the common drain node through the transformer.

Clause 9. The transmitter of any of clauses 1-8, further comprising:
 a power detector configured to sample at least one tap in the transmit chain during the calibration mode of operation to detect at least one output power spectrum; and
 a controller configured to adjust a capacitance of the transmit chain responsive to the at least one output power spectrum, the controller being further configured to adjust a frequency of the local oscillator signal so that a frequency of the mixed RF calibration signal is swept across an output spectrum of the transmitter.

Clause 10. A transmitter, comprising:
 a transmit chain including at least one amplifier;
 a mixer having an output coupled to an input of the transmit chain;
 a signal multiplier configured to generate an RF calibration signal; and
 a set of switches having a first switching state in which an intermediate frequency signal and a local oscillator signal are routed to the mixer and having a second switching state in which a DC offset signal and the RF calibration signal are routed to the mixer.

Clause 11. The transmitter of clause 10, further comprising:
 a frequency multiplier configured to generate the local oscillator signal from a voltage-controlled oscillator signal.

Clause 12. The transmitter of clause 11, wherein the frequency multiplier comprises a frequency doubler.

Clause 13. The transmitter of clause 10, further comprising:
 a voltage-controlled oscillator configured to generate the local oscillator signal, wherein the voltage-controlled oscillator is further configured to adjust a frequency of the local oscillator signal during a calibration mode of operation so that a frequency of the RF calibration signal is swept across an output band for the transmitter.

Clause 14. The transmitter of clause 13, further comprising:
 a power detector configured to sample at least one tap in the transmit chain during the calibration mode of operation to detect at least one output power spectrum; and a controller configured to adjust a capacitance of the transmit chain responsive to the at least one output power spectrum.

Clause 15. A transmitter, comprising:
a transmit chain including at least one amplifier;
a mixer having an output coupled to an input of the transmit chain and having a first input coupled to a node for a local oscillator signal;
a first switch configured to selectively couple an intermediate frequency signal to the mixer; and
a second switch configured to selective couple a frequency-translated version of the local oscillator signal to the mixer.

Clause 16. The transmitter of clause 15, wherein the frequency-translated version of the local oscillator signal comprises a voltage-controlled oscillator signal, the transmitter further comprising:
a frequency multiplier configured to generate the local oscillator signal from the voltage-controlled oscillator signal.

Clause 17. The transmitter of clause 16, wherein the frequency multiplier comprises a frequency doubler.

Clause 18. The transmitter of clause 15, further comprising:
a frequency divider configured to divide the local oscillator signal in frequency to generate the frequency-translated version of the local oscillator signal.

Clause 19. The transmitter of clause 18, wherein the frequency divider comprises a divide-by-two frequency divider.

Clause 20. A method of operation for a transceiver, comprising:
during a calibration mode of operation:
mixing an LO signal with a frequency-translated version of the LO signal to form an RF calibration signal;
mixing the RF calibration signal with a DC offset signal to form a mixed RF calibration signal;
amplifying the mixed RF calibration signal through a transmit chain in the transceiver to form an amplified mixed RF calibration signal; and
adjusting an impedance of the transmit chain responsive to a power measurement of the amplified mixed RF calibration signal to form a tuned transmit chain; and
during a normal mode of operation:
mixing the LO signal with an intermediate frequency signal to form an RF signal; and
amplifying the RF signal through the tuned transmit chain.

Clause 21. The method of clause 20, further comprising:
multiplying a voltage-controlled oscillator signal in frequency to form the LO signal during both the calibration mode of operation and the normal mode of operation, wherein the frequency-translated version of the LO signal comprises the voltage-controlled oscillator signal.

Clause 22. The method of clause 21, wherein multiplying the voltage-controlled oscillator signal in frequency comprises doubling a frequency of the voltage-controlled oscillator signal to form the LO signal.

Clause 23. The method of clause 20, further comprising:
dividing a voltage-controlled oscillator signal in frequency to form the frequency-translated version of the LO signal, wherein the LO signal comprises the voltage-controlled oscillator signal.

Clause 24. The method of clause 23, wherein dividing the voltage-controlled oscillator signal in frequency comprises dividing the voltage-controlled oscillator signal by two in frequency.

Clause 25. The method of any of clause 20-24, wherein adjusting the impedance of the transmit chain responsive to the power measurement of the amplified mixed RF calibration signal comprises:
measuring a power of the amplified mixed RF calibration signal at a first node in the transmit chain to form a first output power spectrum; and
tuning a capacitance of a first tunable capacitor coupled to the first node in the transmit chain responsive to a symmetry of the first output power spectrum.

Clause 26. The method of clause 25, wherein adjusting the impedance of the transmit chain responsive to the power measurement of the amplified mixed RF calibration signal further comprises:
measuring a power of the amplified mixed RF calibration signal at a second node in the transmit chain to form a second output power spectrum;
tuning a capacitance of a second tunable capacitor coupled to the second node in the transmit chain responsive to a symmetry of the second output power spectrum; and
amplifying the mixed RF calibration signal through a receive chain in the transceiver to measure a gain of the receive chain during the calibration mode of operation.

Clause 27. The method of any of clauses 20-26, further comprising: adjusting a phase of the RF signal through a phase shifter in the transmit chain during the normal mode of operation.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A transmitter, comprising:
a transmit chain including at least one amplifier;
a first mixer configured to mix an intermediate frequency signal and a local oscillator signal to form a radio frequency data signal at an input of the transmit chain;
a signal multiplier configured to mix the local oscillator signal with a frequency-translated version of the local oscillator signal to form an RF calibration signal; and
a second mixer configured to mix the RF calibration signal with a DC offset to form a mixed RF calibration signal at the input of the transmit chain.

2. The transmitter of claim 1, further comprising:
a first switch configured to selectively couple the intermediate frequency signal to the first mixer.

3. The transmitter of claim 2, wherein the frequency-translated version of the local oscillator signal comprises a voltage-controlled oscillator signal, the transmitter further comprising:
a frequency multiplier configured to generate the local oscillator signal from the voltage-controlled oscillator signal; and
a second switch configured to couple the voltage-controlled oscillator signal to the signal multiplier.

4. The transmitter of claim 3, wherein the frequency multiplier comprises a frequency doubler, and wherein the first switch is configured to close during a normal mode of operation and to open during a calibration mode of operation, and wherein the second switch is configured to open during the normal mode of operation and to close during the calibration mode of operation.

5. The transmitter of claim 4, wherein the voltage-controlled oscillator signal is a differential signal including a positive component and a negative component, and wherein the frequency doubler comprises:
  a first transistor having a source coupled to ground, a drain connected to a common drain node and a gate coupled to the positive component; and
  a second transistor having a source coupled to ground, a drain connected to the common drain node and a gate coupled to the negative component.

6. The transmitter of claim 5, further comprising:
  a transformer, wherein the signal multiplier comprises a differential pair of transistors having a common source node coupled to the common drain node through the transformer.

7. The transmitter of claim 4, further comprising:
  a power detector configured to sample at least one tap in the transmit chain during the calibration mode of operation to detect at least one output power spectrum; and
  a controller configured to adjust a capacitance of the transmit chain responsive to the at least one output power spectrum, the controller being further configured to adjust a frequency of the local oscillator signal so that a frequency of the mixed RF calibration signal is swept across an output spectrum of the transmitter during the calibration mode of operation.

8. The transmitter of claim 2, further comprising:
  a frequency divider configured to divide the local oscillator signal to form the frequency-translated version of the local oscillator signal; and
  a second switch configured to selectively couple the local oscillator signal to the signal multiplier.

9. The transmitter of claim 8, wherein the frequency divider comprises a divide-by-two frequency divider, and wherein the first switch is configured to close during a normal mode of operation and to open during a calibration mode of operation, and wherein the second switch is configured to open during the normal mode of operation and to close during the calibration mode of operation.

10. A transmitter, comprising:
  a transmit chain including at least one amplifier;
  a mixer having an output coupled to an input of the transmit chain;
  a signal multiplier configured to generate an RF calibration signal; and
  a set of switches having a first switching state in which an intermediate frequency signal and a local oscillator signal are routed to the mixer and having a second switching state in which a DC offset signal and the RF calibration signal are routed to the mixer.

11. The transmitter of claim 10, further comprising:
  a frequency multiplier configured to generate the local oscillator signal from a voltage-controlled oscillator signal.

12. The transmitter of claim 11, wherein the frequency multiplier comprises a frequency doubler.

13. The transmitter of claim 10, further comprising:
  a voltage-controlled oscillator configured to generate the local oscillator signal, wherein the voltage-controlled oscillator is further configured to adjust a frequency of the local oscillator signal during a calibration mode of operation so that a frequency of the RF calibration signal is swept across an output band for the transmitter.

14. The transmitter of claim 13, further comprising:
  a power detector configured to sample at least one tap in the transmit chain during the calibration mode of operation to detect at least one output power spectrum; and
  a controller configured to adjust a capacitance of the transmit chain responsive to the at least one output power spectrum.

15. A transmitter, comprising:
  a transmit chain including at least one amplifier;
  a mixer having an output coupled to an input of the transmit chain and having a first input coupled to a node for a local oscillator signal;
  a first switch configured to selectively couple an intermediate frequency signal to the mixer; and
  a second switch configured to selective couple a frequency-translated version of the local oscillator signal to the mixer.

16. The transmitter of claim 15, wherein the frequency-translated version of the local oscillator signal comprises a voltage-controlled oscillator signal, the transmitter further comprising:
  a frequency multiplier configured to generate the local oscillator signal from the voltage-controlled oscillator signal.

17. The transmitter of claim 16, wherein the frequency multiplier comprises a frequency doubler.

18. The transmitter of claim 15, further comprising:
  a frequency divider configured to divide the local oscillator signal in frequency to generate the frequency-translated version of the local oscillator signal.

19. The transmitter of claim 18, wherein the frequency divider comprises a divide-by-two frequency divider.

20. A method of operation for a transceiver, comprising:
  during a calibration mode of operation:
    mixing an LO signal with a frequency-translated version of the LO signal to form an RF calibration signal;
    mixing the RF calibration signal with a DC offset signal to form a mixed RF calibration signal;
    amplifying the mixed RF calibration signal through a transmit chain in the transceiver to form an amplified mixed RF calibration signal; and
    adjusting an impedance of the transmit chain responsive to a power measurement of the amplified mixed RF calibration signal to form a tuned transmit chain; and
  during a normal mode of operation:
    mixing the LO signal with an intermediate frequency signal to form an RF signal; and
    amplifying the RF signal through the tuned transmit chain.

21. The method of claim 20, further comprising:
  multiplying a voltage-controlled oscillator signal in frequency to form the LO signal during both the calibration mode of operation and the normal mode of operation, wherein the frequency-translated version of the LO signal comprises the voltage-controlled oscillator signal.

22. The method of claim 21, wherein multiplying the voltage-controlled oscillator signal in frequency comprises doubling a frequency of the voltage-controlled oscillator signal to form the LO signal.

23. The method of claim 20, further comprising:
  dividing a voltage-controlled oscillator signal in frequency to form the frequency-translated version of the LO signal, wherein the LO signal comprises the voltage-controlled oscillator signal.

24. The method of claim 23, wherein dividing the voltage-controlled oscillator signal in frequency comprises dividing the voltage-controlled oscillator signal by two in frequency.

25. The method of claim 20, wherein adjusting the impedance of the transmit chain responsive to the power measurement of the amplified mixed RF calibration signal comprises:
- measuring a power of the amplified mixed RF calibration signal at a first node in the transmit chain to form a first output power spectrum; and
- tuning a capacitance of a first tunable capacitor coupled to the first node in the transmit chain responsive to a symmetry of the first output power spectrum.

26. The method of claim 25, wherein adjusting the impedance of the transmit chain responsive to the power measurement of the amplified mixed RF calibration signal further comprises:
- measuring a power of the amplified mixed RF calibration signal at a second node in the transmit chain to form a second output power spectrum;
- tuning a capacitance of a second tunable capacitor coupled to the second node in the transmit chain responsive to a symmetry of the second output power spectrum; and
- amplifying the mixed RF calibration signal through a receive chain in the transceiver to measure a gain of the receive chain during the calibration mode of operation.

27. The method of claim 20, further comprising: adjusting a phase of the RF signal through a phase shifter in the transmit chain during the normal mode of operation.

* * * * *